(12) United States Patent
Nozynski

(10) Patent No.: US 9,548,756 B2
(45) Date of Patent: Jan. 17, 2017

(54) SIGNAL GENERATOR AND METHOD FOR GENERATING SIGNAL PATTERNS

(71) Applicant: Robert Bosch GmbH, Stuttgart (DE)

(72) Inventor: Andrzej Nozynski, Gerlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/810,866

(22) Filed: Jul. 28, 2015

(65) Prior Publication Data
US 2016/0036458 A1   Feb. 4, 2016

(30) Foreign Application Priority Data

Jul. 31, 2014 (DE) .................. 10 2014 215 111
Aug. 5, 2014 (DE) .................. 10 2014 215 464

(51) Int. Cl.
*H03M 1/66* (2006.01)
*G06F 1/02* (2006.01)

(52) U.S. Cl.
CPC . *H03M 1/66* (2013.01); *G06F 1/02* (2013.01)

(58) Field of Classification Search
CPC  H03M 1/66; H03M 2201/30; H03M 2201/32; H03M 2201/834
USPC .................. 341/144–154; 345/534, 538, 549
See application file for complete search history.

(56) References Cited

U.S. PATENT DOCUMENTS

| | | | | |
|---|---|---|---|---|
| 5,235,273 A | * | 8/1993 | Akar | G01R 31/31924 714/724 |
| 5,379,408 A | * | 1/1995 | Izzi | G09G 5/18 713/501 |
| 5,920,331 A | * | 7/1999 | Silverbrook | B41J 2/04 347/14 |
| 6,429,796 B1 | * | 8/2002 | Buckley | G06F 1/0321 327/106 |
| 6,812,874 B1 | * | 11/2004 | Johnson | H03M 1/001 341/110 |
| 2004/0179628 A1 | * | 9/2004 | Haskin | H04L 27/1563 375/271 |
| 2007/0076123 A1 | * | 4/2007 | Ogilvie | G06T 1/20 348/571 |

FOREIGN PATENT DOCUMENTS

CN          103 17 6503          6/2013

\* cited by examiner

*Primary Examiner* — Linh Nguyen
(74) *Attorney, Agent, or Firm* — Norton Rose Fulbright US LLP; Gerard Messina

(57) ABSTRACT

A signal generator includes: a dual-port RAM for digitally storing multiple waveforms in a predefined temporal resolution; multiple channels for modeling in each case one signal pattern from at least one of the waveforms; and multiple digital-analog converters for analog output of the signal patterns in the temporal resolution.

20 Claims, 9 Drawing Sheets

SIGNAL GENERATOR AND METHOD FOR GENERATING SIGNAL PATTERNS

BACKGROUND OF THE INVENTION

1. Field of the Invention

The present invention relates to a signal generator, a method for generating signal patterns, a corresponding computer program, and a machine-readable memory medium which includes such a program.

2. Description of the Related Art

So-called arbitrary waveform generators (AWGs) with analog output via digital-analog converters (DACs) are well known. These types of devices typically operate according to the basic principle of direct digital synthesis (DDS), which may be implemented not only by conventional digital signal processors (DSPs) or application-specific integrated circuits (ASICs), but also with the aid of a field-programmable gate array (FPGA).

Published Chinese patent application CN 103176503 A (published Jun. 26, 2013) provides a DDS signal generator and an amplitude control method for this purpose. The DDS signal generator includes a main control unit, an FPGA module connected thereto, and a composite DAC which in turn is connected to the FPGA module, the main control unit being used for assigning amplitude compensation coefficients and reference voltage values to allow a sum of a bit width of the amplitude compensation coefficients and the bit width of the reference voltage values to be greater than or equal to the bit width of the waveform scanning points. The FPGA module includes a waveform memory for storing waveform scanning points, and a digital multiplier used for multiplying the waveform scanning points by the amplitude compensation coefficients in order to obtain a digital waveform variable and transmit the digital waveform variable to a data DAC installed within the composite DAC. A signal program initiation control module is used for converting the reference voltage values into an SPI form and transmitting them to an amplifier DAC within the composite DAC. Lastly, the composite DAC converts waveform values in the data DAC into analog values according to the reference voltage values in the amplifier DAC.

BRIEF SUMMARY OF THE INVENTION

The present invention is directed to a signal generator, a method for generating signal patterns, a corresponding computer program, and a machine-readable memory medium.

One advantage of this approach lies in the option provided for generating different signal shapes very quickly by utilizing the dual-port RAM. An appropriately equipped field-programmable gate array, for example, may be used for this purpose. Using the dual-port RAM allows simultaneous read and write access to be made to the stored waveforms, and thus exchange of individual signal values during operation, without adversely affecting the access speed during clocking out of the waveforms, and thus the overall functioning of the signal generator.

Thus, for example, a frequency counter which is settable at a programmable update time, an angle clock running in a programmable clock pulse, or an external digital input of the signal generator may be used as clocking out sources for clocking out the waveforms. This variable configuration of the clock-out rate of the individual waves results in further options for modeling the signals.

According to another aspect of the present invention, multiple digital outputs are provided for digitally outputting the signal patterns with regard to a programmable threshold value. The arbitrarily constructed signals may thus be output not only by the digital-analog converters at their specified rate, but also digitally with regard to the programmable threshold value.

According to another aspect of the present invention, multiple configuration and control registers as well as the dual-port RAM may be provided which allow the configuration of the signal generator with the aid of a direct memory access (DMA). Such a direct memory access, also referred to as "burst access," allows the signal generator to exchange the complete contents of the dual-port RAM and of the configuration and control registers during operation, thus providing even more design freedom for modeling arbitrary signals.

According to another aspect of the present invention, the dual-port RAM may include at least one address which is associated with at least two waveforms. This approach allows considerable savings of memory space, since matching segments of various waveforms do not have to be stored separately in the dual-port RAM, but instead may be managed in a particularly space-saving manner by the shared use of a memory area. A temporary or permanent offset may be modeled, for example, with a wave definition which contains only one memory value which is repeatedly played back. The limited capacity of the memory specifically in dual-port RAM modules is thus efficiently utilized. Only fundamental waveforms have to be stored and appropriately played back.

According to another aspect of the present invention, programmable parameters describe the waveforms from which one of the channels is modeled. These parameters are simultaneously re-updated at programmable update times. Thus, the signal generator is able to combine multiple signals with one another in real time, and, due to many options in defining the base signals, to construct arbitrary signals which make up the end signal.

Lastly, according to another aspect of the present invention, each waveform is activated at a programmable activation time and clocked out at a programmable clock-out rate, it being possible to base the activation time on a clock-out source, and to base the clock-out rate either on this clock-out source or some other clock-out source. The described approach opens up a particular synchronization option and flexibility in modeling arbitrary signal patterns.

DETAILED DESCRIPTION OF THE INVENTION

Figure 1:
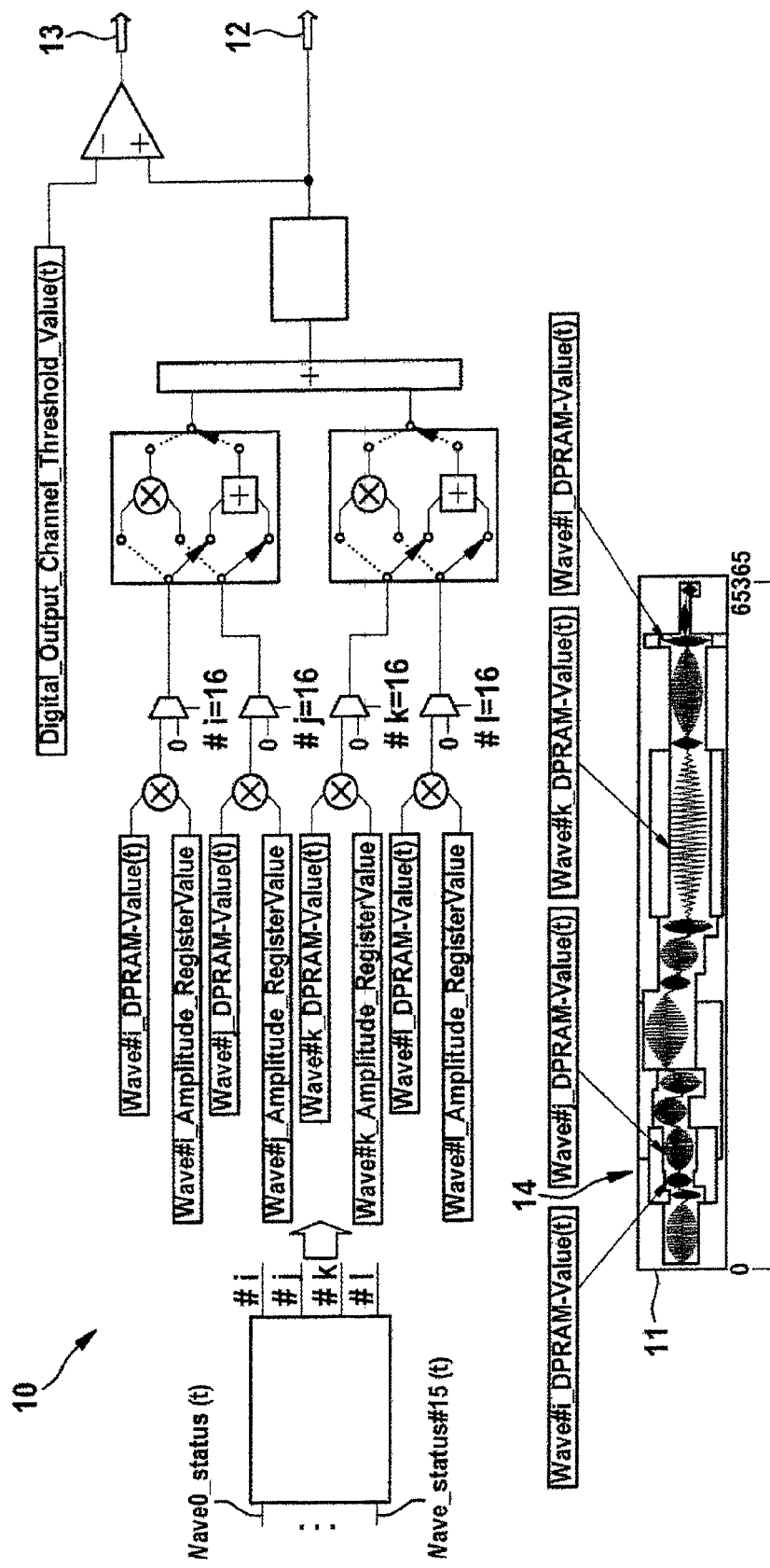
FIG. 1 shows the processing of an output value by a signal generator according to one aspect of the present invention, using the example of sixteen waves and four active waves which are allowed at a point in time.

FIG. 1 illustrates the processing of an output value, using the example of sixteen waveforms, of which four waveforms Wave#i_DPRAM_Value, Wave#j_DPRAM_Value, Wave#k_DPRAM_Value, Wave#1_DPRAM_Value in each case may be simultaneously active, in a flexible variant. A signal generator 10 which includes a dual-port RAM 11, multiple channels, of which only one channel is illustrated in the drawing for reasons of simplicity, and a number of suitable digital-analog converters 12 corresponding to the channels, is used. Signal generator 10 is preferably implemented in the form of a digital circuit which includes memory and logic elements, and which is made up of a programmable logic system in a field-programmable gate array and described with the aid of a suitable hardware description language, such as very high speed integrated circuit hardware description language (VHDL).

In the scenario shown, dual-port RAM 11 stores the total of sixteen waveforms in a temporal resolution which is predefined by digital-analog converters 12 used. A signal pattern made up of multiple waveforms Wave#i_DPRAM_Value, Wave#j_DPRAM_Value, Wave#k_DPRAM_Value, Wave#1_DPRAM_Value is modeled on the channel shown. Digital-analog converter 12, associated with the depicted channel, outputs the modeled signal pattern in its temporal resolution which is predefined by the design. An optional digital output 13 allows a corresponding digital output based on a programmable threshold value Digital_Output_Channel_Threshold_Value.

To deterministically design the system for the user, in the present exemplary embodiment it is established that a maximum of four active waveforms Wave#i_DPRAM_Value, Wave#j_DPRAM_Value, Wave#k_DPRAM_Value, Wave#1_DPRAM_Value contribute to the final output value of a channel. When more than four waveforms are active at a point in time, these waveforms are prioritized in such a way that only the four waveforms Wave#i_DPRAM_Value, Wave#j_DPRAM_Value, Wave#k_DPRAM_Value, Wave#1_DPRAM_Value having the lowest index are used, and the remainder are disregarded. If fewer than four waveforms are active, additional active waveforms Wave#i_DPRAM_Value, Wave#j_DPRAM_Value, Wave#k_DPRAM_Value, Wave#1_DPRAM_Value having the signal value 0 are created. In designing the system, the user should ensure that no more than the four waveforms Wave#i_DPRAM_Value, Wave#j_DPRAM_Value, Wave#k_DPRAM_Value, Wave#1_DPRAM_Value are active at any point in time. However, it is understood that an alternative specific embodiment may establish some other maximum number of active waveforms without departing from the scope of the present invention.

Programmable parameters such as an address and length in dual-port RAM 11, an activation time, together with a corresponding reference as well as a so-called restart mode, describe waveforms Wave#i_DPRAM_Value, Wave#j_DPRAM_Value, Wave#k_DPRAM_Value, Wave#1_DPRAM_Value, from which the shown channel is modeled. For reasons of simplicity, of these parameters FIG. 1 illustrates as an example only the particular amplitude factor Wave#i_Amplitude_RegisterValue, Wave#j_Amplitude_RegisterValue, Wave#k_Amplitude_RegisterValue, Wave#1_Amplitude_RegisterValue of the four waveforms Wave#i_DPRAM_Value, Wave#j_DPRAM_Value, Wave#k_DPRAM_Value, Wave#1_DPRAM_Value which are active at the moment. Whether a wave is active or inactive is simultaneously decided by a digital circuit for all waves of all channels in the clock time grid of the FPGA, for example in a time interval of eight nanoseconds, and thus independently of the clock-out rate of the channel. The association of the particular active waveforms Wave#i_DPRAM_Value, Wave#j_DPRAM_Value, Wave#k_DPRAM_Value, Wave#1_DPRAM_Value thus takes place dynamically. Thus, assuming numerical indexing of the waveforms, it may be the case that in the present clock pulse, waveforms 0, 1, 2, and 3 are active, but eight nanoseconds later, waveforms 0, 2, 7, and 15 are active. When new output values are to be clocked out, instantaneous status Wave#0_status, Wave#15_status of all waveforms is scanned, and the sampled values are frozen for the period of the computation of the output value.

The stated parameters and other parameters, such as the mentioned address and length of the waveform in dual-port RAM 11, the activation time together with a corresponding reference, and the mentioned restart mode may always be reprogrammed at certain freely configurable update times, together and essentially simultaneously, for all sixteen waveforms of the channel shown. For this purpose, at the update time the complete set of the configuration registers of a certain channel is always updated with sixteen wave definitions. The programming of the registers may take place at any time, not just at the update time, and not all registers of a channel have to be reprogrammed. However, it must be ensured that the register set is consistent, and that an FPGA clock pulse is available no later than, for example in the case of a typical implementation, eight nanoseconds prior to the update time. To identify a set of the registers for a channel, each set bears a sequence number which in each case is contained in the configuration register of each channel. As explained in greater detail below, the sequence number which is active at that moment is reported back via a periodic write DMA channel. The signal values of all sixteen waveforms, and in particular of the four active waveforms Wave#i_DPRAM_Value, Wave#j_DPRAM_Value, Wave#k_DPRAM_Value, Wave#1_DPRAM_Value are present in the same dual-port RAM 11, and from there are read out at the clock-out rate associated with each waveform Wave#i_DPRAM_Value, Wave#j_DPRAM_Value, Wave#k_DPRAM_Value, Wave#1_DPRAM_Value. As is apparent from the assignment of dual-port RAM 11 according to FIG. 1, dual-port RAM 11 includes an address range 14 which is associated with two active waveforms Wave#i_DPRAM_Value, Wave#j_DPRAM_Value at the same time.

In the flexible variant of signal generator 10 shown in FIG. 1, first active waveform Wave#i_DPRAM_Value weighted with amplitude factor Wave#i_Amplitude_RegisterValue is modulated with second active waveform Wave#j_DPRAM_Value weighted with its amplitude factor Wave#j_Amplitude_RegisterValue in the course of the multiplication, whereupon the products are in turn summed. Similarly, third active waveform Wave#k_DPRAM_Value weighted with amplitude factor Wave#k_Amplitude_RegisterValue is also modulated with fourth active waveform Wave#1_DPRAM_Value weighted with its amplitude factor Wave#1_Amplitude_RegisterValue in the course of the multiplication, whereupon these particular products are in turn also summed. It is understood that some other combination of active waveforms Wave#i_DPRAM_Value, Wave#j_DPRAM_Value, Wave#k_DPRAM_Value, Wave#1_DPRAM_Value may take place instead, taking into account their respective amplitude factors Wave#i_Amplitude_RegisterValue, Wave#j_Amplitude_RegisterValue, Wave#k_Amplitude_RegisterValue, Wave#1_Amplitude_RegisterValue, without departing from the scope of the present invention.

Figure 2:
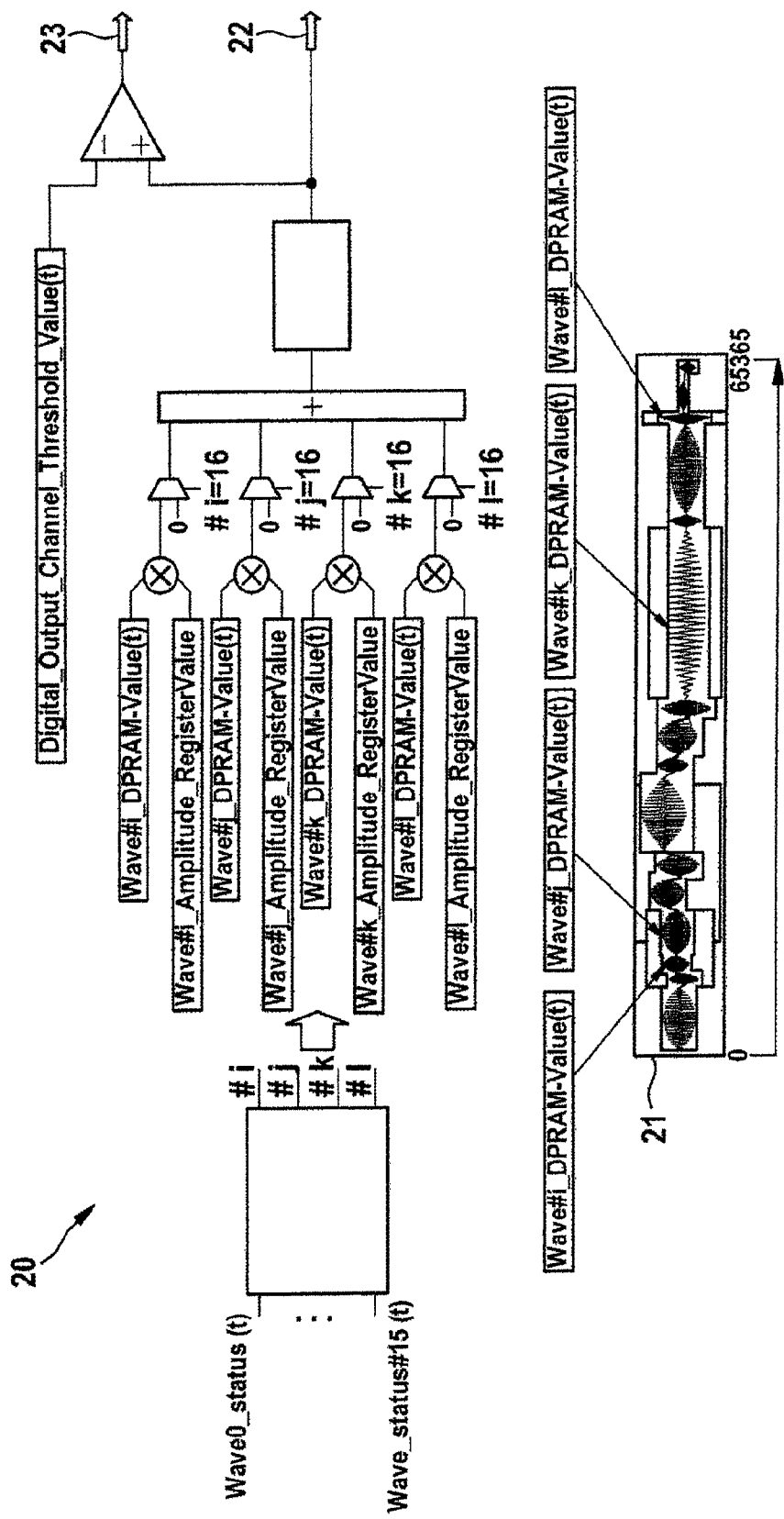
FIG. 2 shows, in comparison, the mode of operation of a simplified signal generator based solely on superposition, according to another aspect of the present invention.

According to another aspect of the present invention depicted in FIG. 2, in one simplified variant 20 of the signal generator only a superposition of the four active waveforms Wave#i_DPRAM_Value, Wave#j_DPRAM_Value, Wave#k_DPRAM_Value, Wave#1_DPRAM_Value weighted with their amplitude factors is possible, but no modulation is possible.

Figure 3:
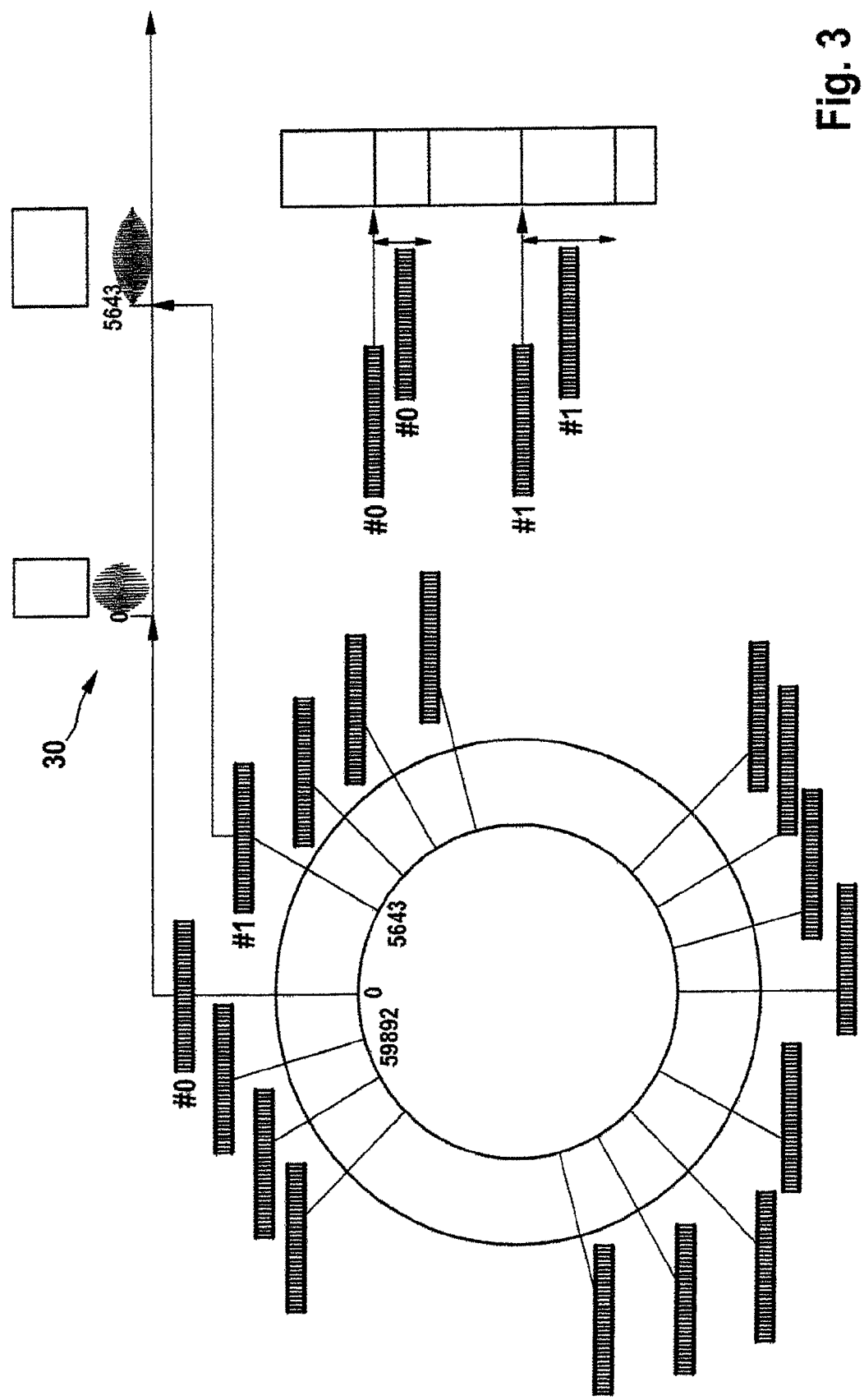
FIG. 3 illustrates the relationship between the activation time, starting address, and length of a wave in the dual-port RAM according to another aspect of the present invention.

As illustrated in FIG. 3, according to another aspect of the present invention, each channel of signal generator 10, 20 is similarly configured. For this purpose, so-called clock-out sources, such as a free-running frequency counter which is settable at a programmable update time or which restarts at a new update time, an angle clock which runs in a programmable clock pulse, or an external digital input of signal generator 10, 20 is associated with the channel. The maximum frequency which may be set corresponds to the reciprocal of the rate of digital-analog converter 12, 22. If n denotes the number of stored waveforms Wave#i_DPRAM_Value, Wave#j_DPRAM_Value, Wave#k_DPRAM_Value, Wave#1_DPRAM_Value, and x denotes the number of available clock-out sources, according to one aspect of the present invention, the following relationships apply for the number y of configurable clock-out sources:

$$x > y$$

and $$y < n$$

Exactly one of the y clock-out sources is preferably associated with each of the n stored waveforms Wave#i_DPRAM_Value, Wave#j_DPRAM_Value, Wave#k_DPRAM_Value, Wave#1_DPRAM_Value. An active waveform Wave#i_DPRAM_Value, Wave#j_DPRAM_Value, Wave#k_DPRAM_Value, Wave#1_DPRAM_Value is output at the rate of its associated clock-out source. For this purpose, the read pointer in dual-port RAM 11, 21, 31 is repeatedly incremented by 1 at the rate of the clock-out source as long as waveform Wave#i_DPRAM_Value, Wave#j_DPRAM_Value, Wave#k_DPRAM_Value, Wave#1_DPRAM_Value in question is active.

Figure 4:
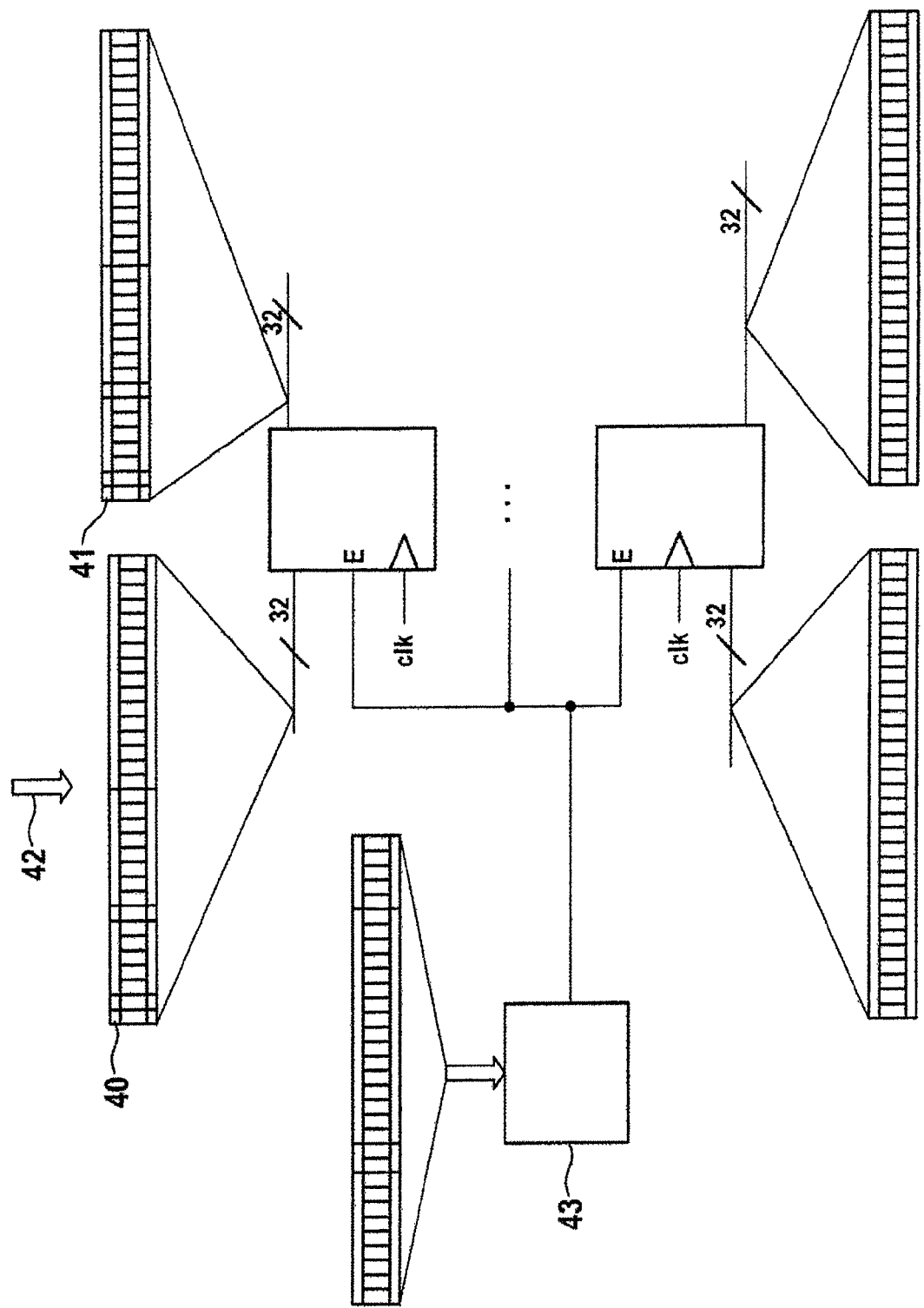
FIG. 4 illustrates the update time configuration and register exchange, based on another aspect of the present invention.

The further aspect of the present invention according to FIG. 4 illustrates a particular synchronization option and flexibility in modeling arbitrary signal patterns 30. Thus, activation time 53, 63, 73, 83, i.e., the counter value or angular value of a waveform Wave#i_DPRAM_Value, Wave#j_DPRAM_Value, Wave#k_DPRAM_Value, Wave#1_DPRAM_Value, may be based not only on its associated clock-out unit, but also on any other of the y clock-out sources selected for its channel. For clocking out waves, signal generator 10, 20 uses only its operating configuration and control registers 41 on the right side, and not configuration and control registers 40 on the left side. Since many values must be changed all at once, DMA burst accesses or direct accesses 42, not individual register accesses, are used. In the process, a complete set or a portion of directly contiguous registers 40 for a channel and its wave definitions are transmitted. However, these data are not used immediately by digital signal generator, 10, 20, but instead are used as operating configuration and control registers 41 only after the programmable trigger or update time, thus ensuring the synchronization of the data. This update time is encoded in the new data set in configuration and control registers 40, and corresponds to a counter value which is based on one of the reference clock-out sources already described. As previously mentioned, each channel includes a register which contains the sequence number (identification) of the register set. The data transfer is automatically reported back to the entity which has initiated the register exchange via a periodic write DMA channel, so that this entity may once again provide new data in the event that the received sequence number of a channel in operating configuration and control registers 41 has changed.

Figure 9:
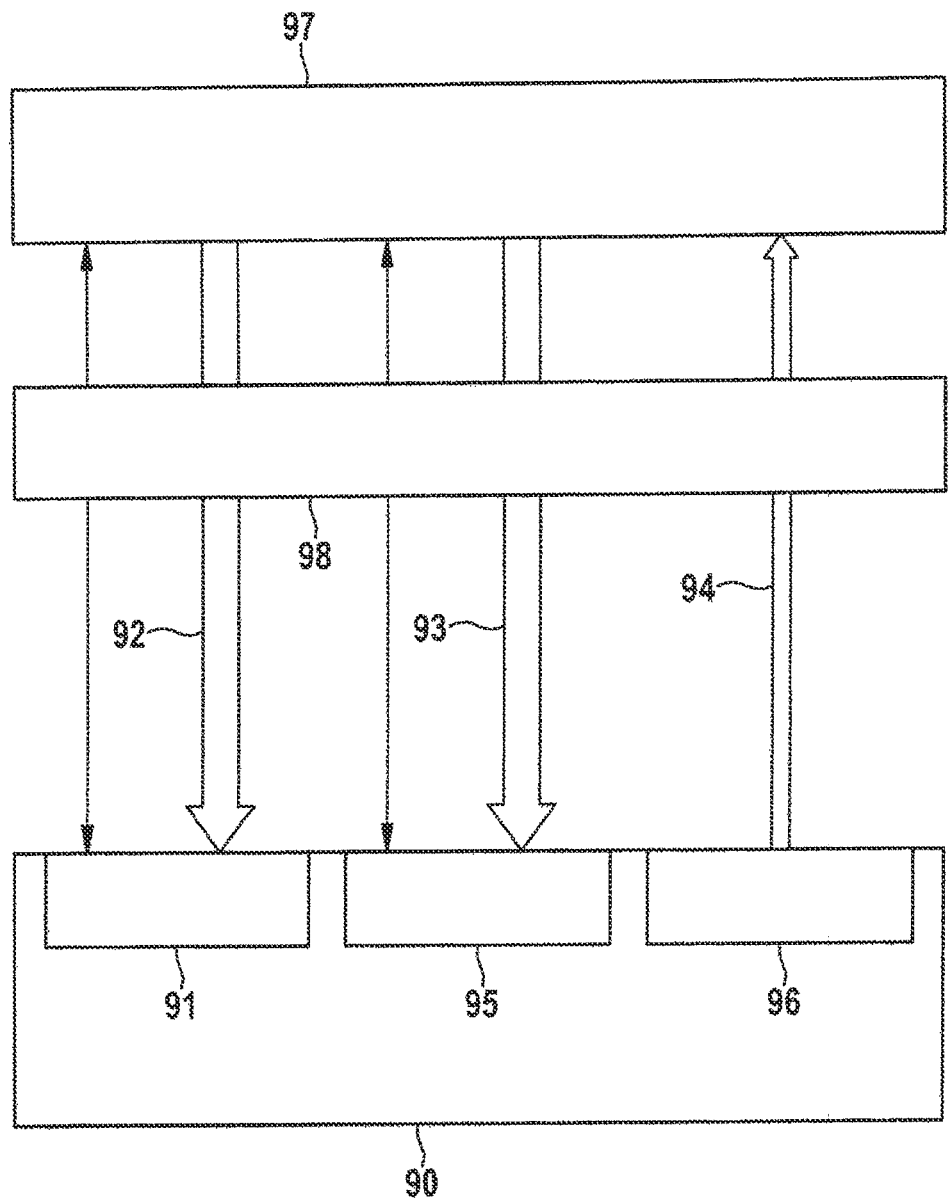
FIG. 9 shows the direct memory access to configuration and control registers, and the dual-port RAM of the signal generator, according to another aspect of the present invention.

Block 43 symbolizes a detection circuit for the update time of a channel, the detection circuit evaluating in each FPGA clock pulse the update condition encoded in a dedicated register 40a associated with register set 40. If the update condition is met, the so-called enable signal for the length of a clock pulse is activated in order to simultaneously transfer the contents of the registers from the left side of the drawing into the registers on the right side of the drawing, as a result of which registers 40 become operating registers 41. Reference is made to the block diagram in FIG. 9 for better understanding of this process. As illustrated in this figure, according to this aspect of the present invention, signal generator 90 uses two read DMA channels 92, 93 and one write DMA channel 94 for reading out status registers 96, which it shares with other entities. First read DMA channel 92 is used for describing dual-port RAM 91, it being possible to exchange an arbitrary number of the memory cells in dual-port RAM 91, or also its entire contents, during operation. Second read DMA channel 93 is used for describing configuration and control registers 95 of signal generator 90. A DMA read transfer to dual-port RAM 91 or to configuration and control registers 95 is started when a start bit is set by a so-called requester, i.e., an entity, in a configuration and control register 95 used for controlling the direct memory access, the so-called DMA control register, of the particular read DMA channel. Each read DMA channel 92, 93 includes a DMA control register of this type. In addition to the start bit, the DMA control register includes the information concerning how much data is "picked up" and from where, and at which offset address the data are to be stored in configuration and control registers 95 or dual-port RAM 91. A single medium-size burst direct memory access is sufficient for exchanging a complete configuration register set for an output channel together with its associated waveform definitions. The direct memory access is characterized by very rapid data throughput and high efficiency. When a direct memory access takes place, two adjacent 32-bit configuration and control registers 95 or four adjacent 16-bit memory cells of dual-port RAM 91 in address map 97 are programmed at once within one FPGA clock pulse, via a PCI express interface (PCIe) 98. According to one aspect of the present invention, dual-port RAM 91 as well as configuration and control registers 95 of signal generator 90 may also be programmed via individual write accesses without direct memory access, which for efficiency reasons, however, is meaningful primarily for individual accesses. Configuration and control registers 95, for example the mentioned DMA control register, are programmable only via register write access, but not via direct memory access.

Figure 5:
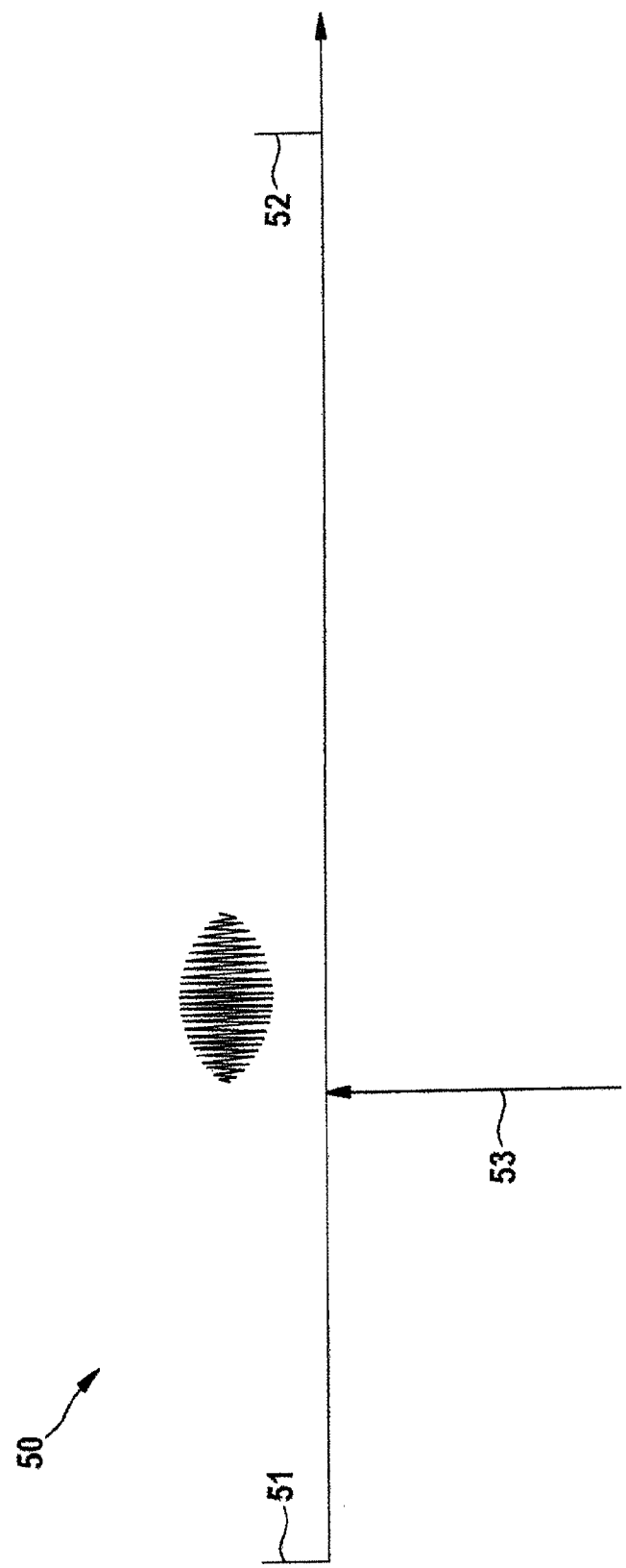
FIG. 5 shows the clocking out of a waveform when a zeroth restart mode is selected.

The selection of a restart mode provided according to another aspect of the present invention deserves separate consideration, for which reason FIGS. 5 through 8 illustrate corresponding options. Specifically, FIG. 5 shows signal pattern 50 between a first update time 51 and a subsequent second update time 52 for restart mode 0. In this mode, the underlying waveform starts at activation time 53, and enters into signal pattern 50 only once.

Figure 6:
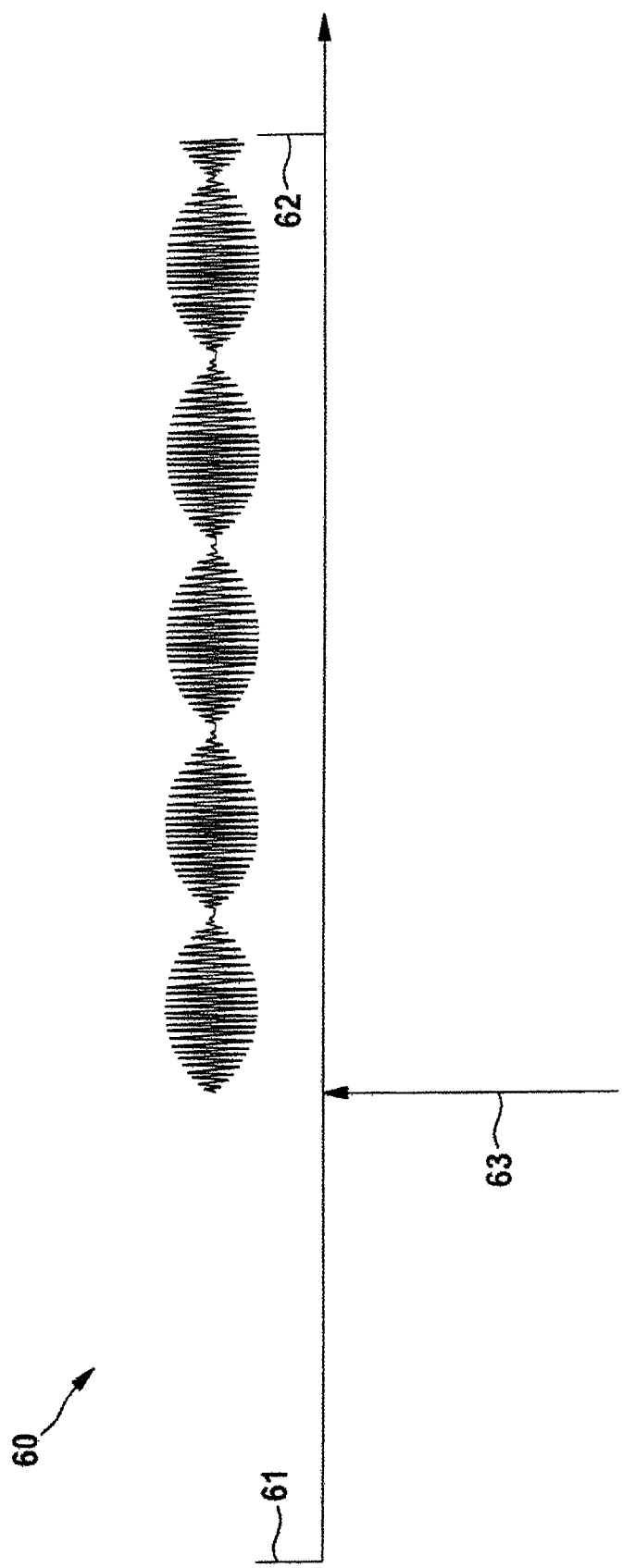
FIG. 6 shows the clocking out of a waveform when a first restart mode is selected.

FIG. 6 shows, in comparison, the result of restart mode 1. In this mode, the clocking out of the waveform requested at first update time 61 starts within the scope of the modeling of signal pattern 60 at programmed activation time 63, and continuously repeats until second update time 62.

Figure 7:
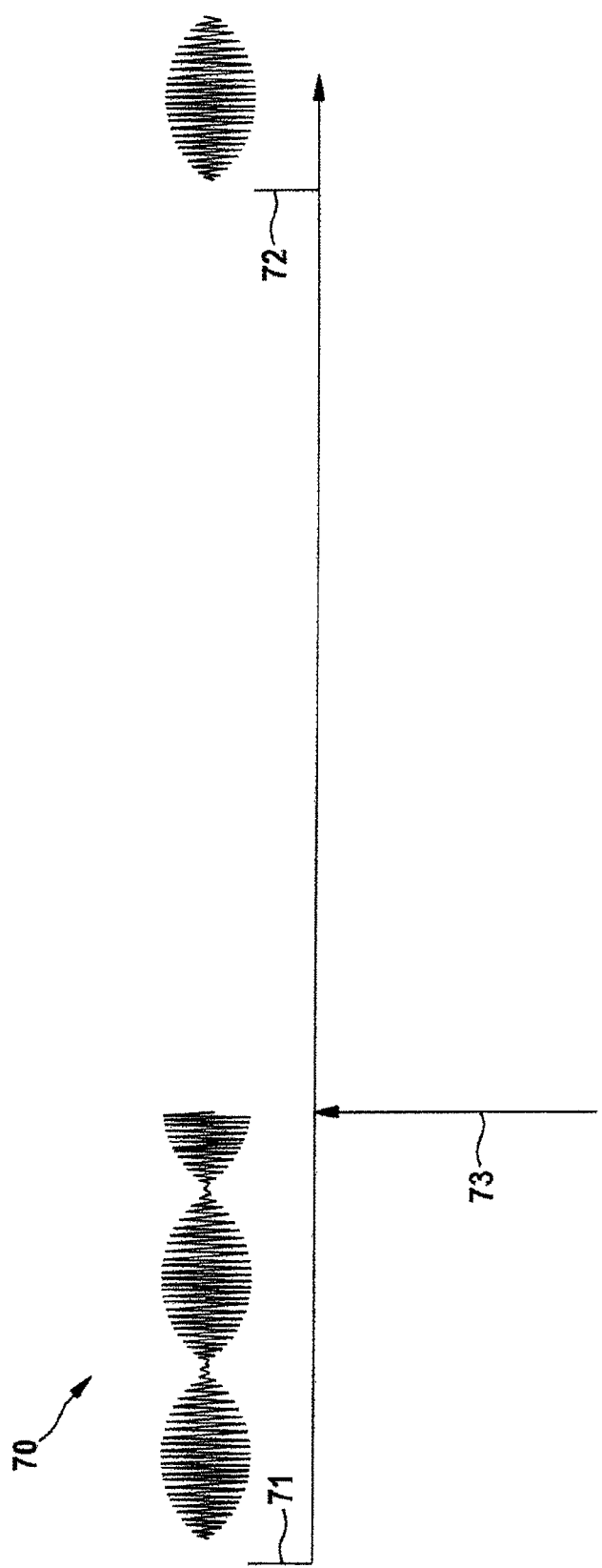
FIG. 7 shows the clocking out of a waveform when a second restart mode is selected.

A complementary result, so to speak, is achieved by selecting restart mode 2, as shown in FIG. 7. Here, the clocking out of the waveform for purposes of modeling signal pattern 70 starts directly at first update time 71, and ends at activation time 73. The clocking out restarts at second update time 72, provided that restart mode 2 is still active at this point in time.

Figure 8:
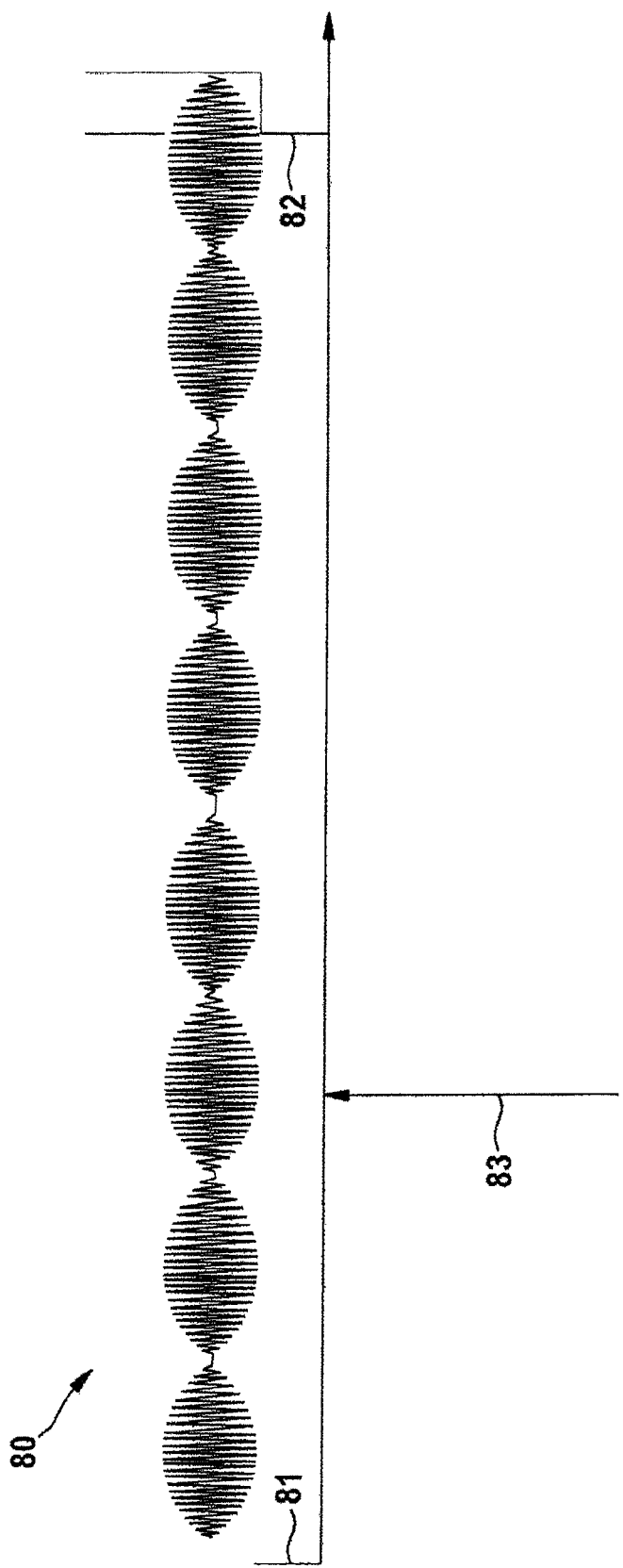
FIG. 8 shows the clocking out of a waveform when a third restart mode is selected.

Lastly, restart mode 3 illustrated in FIG. 8 is characterized by a continuous repetition of the waveform while maintaining its phase position. In this case as well, the clocking out continues beyond second update time 82, provided that the waveform is still active at this point in time and restart mode 3 is still selected.

What is claimed is:

1. A signal generator comprising:
a dual-port RAM for digitally storing multiple waveforms in a predefined temporal resolution;
at least one programmable register;
multiple channels connected to the dual-port RAM, each of the channels modeling one signal pattern from a selected combination of the stored waveforms, wherein for the modeling, values of the stored waveforms of the selected combination are weighted based on at least one value stored in the at least one programmable register; and
multiple digital-analog converters for analog output of the signal patterns from the multiple channels at the temporal resolution.

2. The signal generator as recited in claim 1, wherein at least one of the following clock-out sources is provided for clocking out the waveforms:
a frequency counter which is settable at a programmable update time;
an angle clock running in a programmable clock pulse; and
an external digital input of the signal generator.

3. The signal generator as recited in claim 1, further comprising:
multiple digital outputs for digitally outputting signal patterns with regard to a programmable threshold value.

4. The signal generator as recited in claim 1, further comprising:
multiple configuration-and-control registers for configuring the multiple channels of the signal generator with the aid of a direct memory access.

5. The signal generator as recited in claim 1, wherein the dual-port RAM is configurable by a direct memory access.

6. The signal generator as recited in claim 5, wherein the dual-port RAM includes at least one address which is associated with at least two waveforms simultaneously.

7. A method for generating signal patterns-with the aid of a signal generator having a dual-port RAM, at least one programmable register; multiple channels connected to the dual-port RAM, and multiple digital-analog converters, the method comprising:
storing the multiple waveforms in the dual-port RAM, the waveforms being in a predefined temporal resolution;
selecting a combination of the stored waveforms from among the stored waveforms;
modeling, in each one of the channels, a respective signal pattern from the selected combination of the stored waveforms, the modeling including applying a weighting to values of the stored waveforms of the selected combination based on at least one value stored in the at least one programmable register; and
outputting, by the multiple digital-analog converters, an analog form of the signal patterns from the multiple channels in the temporal resolution.

8. The method as recited in claim 7, wherein the at least one programmable parameter is simultaneously reprogrammed at programmable update times.

9. The method as recited in claim 8, wherein each waveform is activated for modeling at a programmable activation time, and wherein each waveform is clocked out at a programmable clock-out rate, the activation time being based on a first clock-out source, and the programmable clock-out rate being based on a second clock-out source.

10. A non-transitory, computer-readable data storage medium storing a computer program having program codes which, when executed on a computer, perform a method for generating signal patterns with the aid of a signal generator having a dual-port RAM, at least one programmable register, multiple channels connected to the dual-port RAM, and multiple digital-analog converters, the method comprising:
storing the multiple waveforms in the dual-port RAM, the waveforms being in a predefined temporal resolution;
selecting a combination of the stored waveforms from among the stored waveforms;
modeling, in each one of the channels, a respective signal pattern from a selected combination of the stored waveforms, the modeling including applying a weighting to values of the stored waveforms of the selected combinations based on at least one value stored in the at least one programmable register; and
outputting, by the multiple digital-analog converters, an analog form of the signal patterns from the multiple channels in the temporal resolution.

11. The signal generator as recited in claim 6, wherein during the modeling, one of a temporary offset and a permanent offset is implemented to define in one of the multiple channels the respective signal pattern with a repeated play back.

12. The signal generator as recited in claim 1, wherein each of the modeled signal patterns is formed from a superposition of the selected combination of the stored waveforms.

13. The signal generator as recited in claim 1, wherein the dual-port RAM is configured to simultaneously respond to: (a) at least one read operation to access the digitally stored multiple waveforms, and (b) at least one write operation to access the digitally stored multiple waveforms.

14. The signal generator as recited in claim 13, wherein the dual-port RAM includes a read pointer that, at a rate of a clock-out source, is incremented by a pre-defined value so long as the signal patterns being modeled over the multiple channels remains constant.

15. The signal generator as recited in claim 1, wherein each of the multiple channels: (i) activates one of the stored multiple waveforms at a programmable activation time based on a first clock source and (ii) outputs the modeled signal patterns at a clock-out rate based on one of the first clock source or a second clock source.

16. The signal generator as recited in claim 4, further comprising:
    a detection circuit evaluating, at a programmable activation time, a condition in at least one register in a second set of multiple configuration-and-control registers,
    wherein, when the condition is met, enabling a copy of one of: (i) all contents and (ii) a portion of all contents of the second set of multiple configuration- and- control registers to the multiple configuration- and- control registers, and
    wherein during the copy the multiple configuration-and-control registers are used for the digitally outputting, while after the copy the second set of multiple configuration- and- control registers are used for the digitally outputting.

17. The signal generator as recited in claim 1, further comprising:
    a digital circuit that selects, for the multiple channels, the combination from amongst the stored waveforms.

18. The method as recited in claim 7, wherein the outputting occurs at a rate of a clock-out source, and wherein a read pointer of the dual-port RAM is incremented at the rate of the clock-out source while the modeling is based on a same set of the stored multiple waveforms.

19. The method as recited in claim 7, further comprising:
    upon a selection of a restart mode, prompting a particular manner of outputting the analog output at an activation time during a time period beginning with a first update time and ending with a second update time.

20. The method as recited in claim 18, wherein:
    when the restart mode is:
        a zero mode, the analog output begins at the activation time and provides the modeled signal patterns only once,
        a first mode, the analog output begins at the activation time and provides the modeled signal patterns on a repeating basis until the second update time,
        a second mode, the analog output provides the modeled signal patterns on a repeating basis beginning at the first update time and the second update time and ending at the activation time, and
        a third mode, the analog output begins at the first update time until the second update time but completes a full cycle of the modeled signal patterns even if the full cycle continues after the second update time.

* * * * *